United States Patent [19]
Paice

[11] 4,083,001
[45] Apr. 4, 1978

[54] MEASUREMENT OF MOTOR WINDING TEMPERATURE

[75] Inventor: Derek A. Paice, Murrysville, Pa.

[73] Assignee: Westinghouse Electric Corporation, Pittsburgh, Pa.

[21] Appl. No.: 755,381

[22] Filed: Dec. 29, 1976

[51] Int. Cl.$^2$ .................. G01R 31/06; G01R 27/02
[52] U.S. Cl. .................. 324/158 MG; 73/362 AR; 324/62
[58] Field of Search ............ 324/158 MG, 62 R, 119, 324/117 R; 73/362 AR

[56] References Cited
U.S. PATENT DOCUMENTS

| | | | |
|---|---|---|---|
| 1,952,072 | 3/1934 | Jewell | 324/117 R |
| 3,769,576 | 10/1973 | Norkaitis | 324/62 |

Primary Examiner—Rudolph V. Rolinec
Assistant Examiner—Ernest F. Karlsen
Attorney, Agent, or Firm—G. H. Telfer

[57] ABSTRACT

The temperature of a motor winding is measured or monitored by measuring the resistance of the winding. This is done by introducing a small direct current component into the motor current, which can be done by connecting an asymmetric resistance device in the motor circuit. The resistance of the motor winding can then be determined from measurements of the direct current component and the corresponding voltage. This can also be done by using a magnetic amplifier with a bias winding excited in response to the voltage of the asymmetric resistance and a control winding excited by the motor current. A signal or indication can then be obtained when the current falls below a level which indicates a resistance corresponding to an overtemperature condition.

10 Claims, 2 Drawing Figures

MEASUREMENT OF MOTOR WINDING TEMPERATURE

BACKGROUND OF THE INVENTION

The present invention relates to measurement of the temperature of motor windings, and more particularly to the determination of the temperature by measuring the resistance of the winding.

It is frequently necessary or desirable to determine the temperature of a motor winding, for protection or other purposes, and it is often desired to monitor the winding temperature continuously so that the motor can be deenergized or other appropriate action taken if the temperature exceeds a safe value. Various means have been used for this purpose such as thermistors or other temperature detectors placed on the motor windings to respond directly to the temperature, or current responsive devices for tripping the motor circuit breaker in response to excessive current which would produce overheating if allowed to continue. Since motor windings normally consist of copper conductors, with a positive temperature coefficient of resistance, the temperature of the winding can also be determined by measuring the resistance, but this method of temperature detection has not heretofore been used because of various practical difficulties in measuring the resistance, especially on a continuous basis during operation of the motor.

SUMMARY OF THE INVENTION

In accordance with the present invention, means are provided for measuring the resistance of an alternating current motor winding, or for continuously monitoring the resistance during operation, to determine the temperature of the motor winding and to provide a suitable signal or indication when the resistance and, therefore, the temperature exceed a desired value. In accordance with the invention, this is done by introducing a small direct current component into the motor winding, which is preferably done by means of an asymmetric resistance device connected in the motor circuit. The asymmetric resistance device can be any bilaterally conductive device having different resistances in opposite directions of current flow. The small current component thus introduced, and the corresponding voltage, can then be measured and the winding resistance calculated in a simple manner. In order to effectively prevent the alternating current component influencing the measuring device and to provide for continuous monitoring of the resistance, a magnetic amplifier can desirably be used. Such a device can have a bias winding responsive to the voltage of the asymmetric resistance device and a control winding responsive to the motor current, and can readily be arranged to give a definite indication when the resistance of the motor increases to the point corresponding to the maximum allowable winding temperature.

BRIEF DESCRIPTION OF THE DRAWINGS

The invention will be more fully understood from the following detailed description, taken in connection with the accompanying drawing, in which.

DESCRIPTION OF THE PREFERRED EMBODIMENT

As discussed above, the present invention provides means for measuring the resistance of a motor winding in order to determine the winding temperature. In accordance with the invention, this is done by introducing a small direct current component into the motor circuit which may be done by means of an asymmetrical resistance device or by any means which will introduce an asymmetry into the alternating current waveform.

Figure 1:
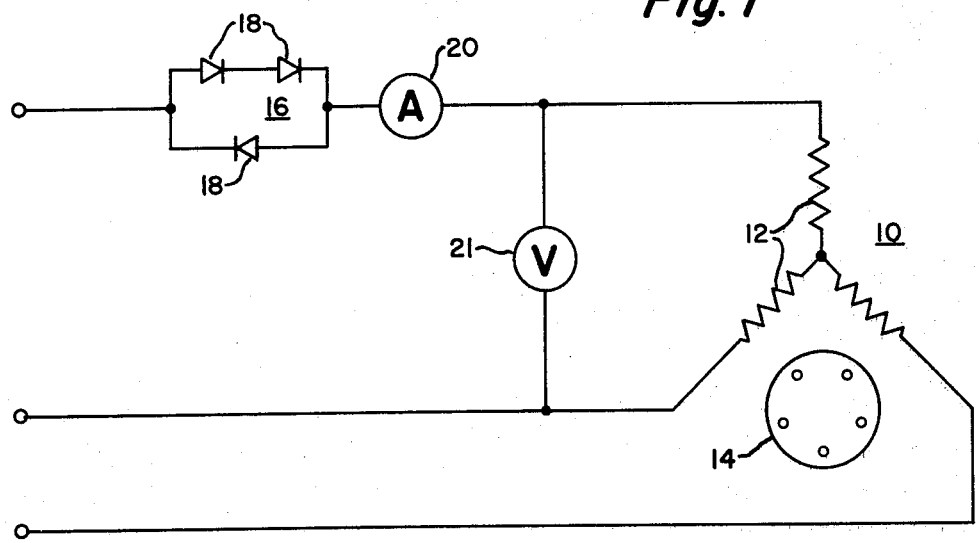
FIG. 1 is a schematic diagram illustrating a simple embodiment of the invention.

A simple embodiment of the invention illustrating the principle is shown in FIG. 1. As there shown, an alternating current induction motor 10 has a three-phase stator winding 12, which may be of any suitable or desired type, and a squirrel-cage rotor 14. The motor winding 12 is normally arranged in slots in a laminated stator core and is excited by alternating current. In such a motor, it is desirable to provide means for detecting or monitoring the winding temperature in order to avoid dangerous or undesirable overtemperature conditions. The present invention provides for doing this by measurement of the winding resistance, which is a function of the motor temperature since the metallic winding conductors have a positive temperature coefficient of resistance.

The winding resistance can be measured in the manner shown in FIG. 1 by introducing a small direct current component into the motor circuit which may, for example, be of the order of 2% of the motor rated current, so that its presence does not significantly affect the operating characteristics or performance of the motor. This direct current component can be introduced into the circuit in any desired manner. Preferably, an asymmetric resistance device 16 may be used which may be any bilaterally conductive device which has different resistance in opposite directions of current flow so that it introduces a small asymmetry into the alternating current waveform resulting in the presence of a small direct component. As shown in FIG. 1, the asymmetric resistance device 16 may take the form of a circuit having two parallel branches with diodes 18 connected with opposite polarity in the two branches so that the device is conductive in both directions. The asymmetric characteristics is obtained by using different numbers of diodes in the two branches so that the resistances are different. As shown in FIG. 1, the device may have one diode in one branch and two diodes in the other branch, so that the effective direct current resistance is twice as great in one direction of current flow as in the other. Alternating current flowing through this device, therefore, will have slightly higher amplitude in the half-cycles of one polarity than in the other, corresponding to a small current component which is thus introduced into the circuit. It will be understood, of course, that any suitable means may be utilized for producing such as asymmetry. The resistance of the motor winding 12 can then be readily determined by measuring the magnitude of the direct current component, as by a direct current ammeter 20, and by measuring the voltage across the motor windings, as by a direct current voltmeter 21. It will be understood that the meters 20 and 21 should respond only to the direct current component, and the winding resistance can then be calculated directly from the voltage and current measurements. The voltmeter 21 is shown as being connected directly across the motor winding 12 which is desirable in order to eliminate the effect of the source resistance, but if this resistance is small enough to be negligible compared to the motor resistance, the voltage across the asymmetric device 16 could be utilized equally well.

Figure 2:
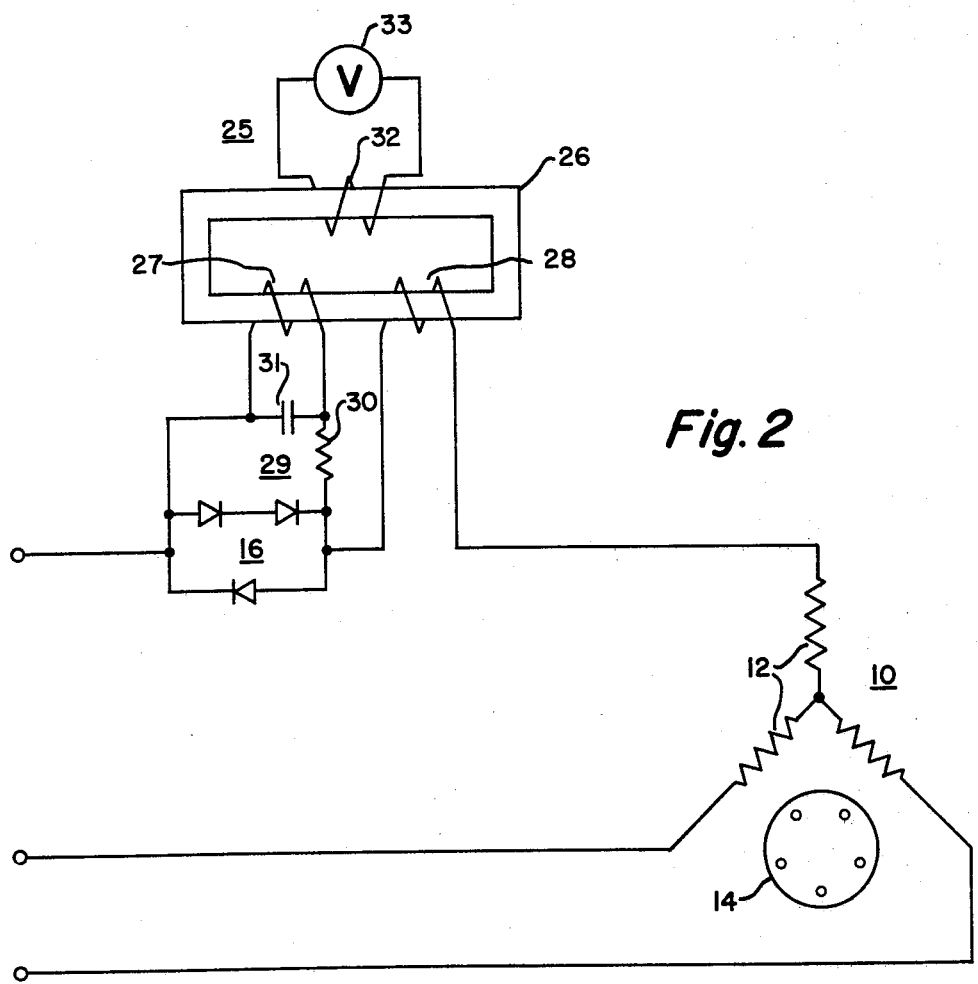
FIG. 2 is a similar diagram showing another embodiment of the invention.

As indicated above, the current and voltage measurements should be made only on the direct current component and the sensing or measuring devices, therefore, should not respond to alternating current. It is also desirable to provide for continuously monitoring the winding resistance, and hence the temperature, and to provide a signal or indication when the temperature reaches the predetermined value. Both of these results can be obtained in a relatively simple manner by the use of a magnetic amplifier as shown in FIG. 2. The motor 10 and asymmetric resistance device 16 shown in this figure are the same as those shown and described in connection with FIG. 1. In this embodiment, however, a magnetic amplifier 25 is used to monitor the winding resistance. The amplifier 25 has a saturable magnetic core 26 of usual type provided with a bias winding 27 and a control winding 28. The bias winding 27 is connected to respond to the voltage of the asymmetric resistance 16 and is shown as being connected directly across this device. A bypass filter 29, consisting of a series inductance 30 and a capacitor 31, is connected across the bias winding 27 to bypass the alternating current so that the bias winding is excited only by the direct current component of the motor current to provide the desired bias field. The control winding 28 is connected in series with the motor winding 12 as shown to carry the motor current and since this is an alternating current, the net ampere turns produced by the winding 28 will be those due only to the direct current component of the motor current. The magnetic amplifier 25 also has an output winding 32 which is connected to any desired type of meter or indicating device 33.

In operation, the direct current voltage across the bias winding 27 is substantially constant and the bias winding sets up a bias field of constant magnitude in the magnetic core 26. Under normal or low resistance conditions, the control winding 28 sets up an opposing field of greater magnitude than the bias field because the control field is designed to produce more ampere turns under these conditions. The control field, therefore, overbalances the bias field. A relatively high output is then produced by the winding 32 which indicates the low resistance condition. If the temperature of the motor winding 12 rises, however, the resistance of the winding correspondingly increases and the magnitude of the direct current component decreases. The ampere turns produced by the control winding 28, therefore, also decrease and, at the point corresponding to the desired maximum motor temperature, the field of the bias winding 27 exceeds that of the control winding 28. The output of the winding 32 drops sharply at this point to a very low value, and if the magnetic amplifier 25 is designed with relatively high gain, it functions essentially like a switch to turn the output OFF when the temperature exceeds the desired level. The device 33 may be a voltmeter which indicates the ON or OFF condition, or it may be an indicating or warning device of any desired type, either visual or audible, or it may cause any other desired response to overtemperature such as tripping a circuit breaker to deenergize the motor.

A magnetic amplifier is particularly well suited for use as described because it responds to the average flux and is relatively insensitive to noise. If it is designed with high enough gain, it functions essentially as a switch and can be used as an ON-OFF type of device for signaling or control purposes to respond to overtemperature of the motor winding. Other sensing devices such as those using Hall elements could, of course, be used and in general any type of sensing or measuring device could be utilized which responds to the current and voltage corresponding to a small direct current component introduced into the motor circuit by an asymmetric resistance device or equivalent means.

What is claimed is:

1. In combination, an electric motor having a winding with terminals for application of alternating current thereto, said winding characterized by increasing resistance with increasing temperature, means for developing a small direct current component from the applied alternating current and introducing said direct current component into the circuit of said motor winding along with said alternating current, and means responsive to said direct current component for determining the resistance of the winding.

2. The combination of claim 1 in which said means for developing a direct current component is an asymmetric resistance device connected in series with the motor winding.

3. The combination of claim 2 in which said asymmetric resistance device comprises a plurality of like diodes connected with opposite polarities in two parallel branches, said branches having different numbers of diodes.

4. The combination of claim 2 including means for measuring the direct current component and for measuring the corresponding voltage across the motor winding to determine the winding resistance.

5. The combination of claim 1 including magnetic means for monitoring said direct current component, said magnetic means being adapted to indicate whether said current is above or below a predetermined value.

6. The combination of claim 2 including a magnetic amplifier having a bias winding responsive to the direct current voltage across the motor winding, a control winding responsive to the direct current component, and means for providing an output signal when said current is above a predetermined value.

7. The combination of claim 2 including a magnetic amplifier having a saturable core, a bias winding on said core connected across said asymmetric resistance device, a bypass filter connected across said bias winding so that the bias winding responds only to the direct current component, a control winding on the core connected to carry the motor current, and an output winding on the core adapted to provide an output signal when the direct current component of the motor current is above a predetermined value.

8. A method for monitoring the temperature of a motor winding comprising:
applying to terminals of the winding an alternating current for motor operation;
developing from the applied alternating current a small direct current component;
applying the direct current component simultaneously with the alternating current to the winding while the motor is operating; and
detecting changes in the magnitude of the direct current.

9. A method in accordance with claim 8 wherein:
the step of developing the direct current component is performed by an asymmetric resistance device in series circuit relation between the winding terminals and the winding.

10. A method in accordance with claim 9 wherein:
the step of detecting changes in the magnitude of the direct current is performed by a magnetic amplifier inductively coupled to the winding circuit.

* * * * *